(12) United States Patent
Sriram

(10) Patent No.: US 6,902,964 B2
(45) Date of Patent: Jun. 7, 2005

(54) METHODS OF FABRICATING DELTA DOPED SILICON CARBIDE METAL-SEMICONDUCTOR FIELD EFFECT TRANSISTORS HAVING A GATE DISPOSED IN A DOUBLE RECESS STRUCTURE

(75) Inventor: Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/909,112

(22) Filed: Jul. 30, 2004

(65) Prior Publication Data

US 2005/0023535 A1 Feb. 3, 2005

Related U.S. Application Data

(62) Division of application No. 10/136,456, filed on Oct. 24, 2001.

(51) Int. Cl.$^7$ ...................... H01L 21/338; H01L 21/28; H01L 21/44
(52) U.S. Cl. ......................... 438/167; 438/172; 438/571
(58) Field of Search ............................... 438/167, 172, 438/571, 572, 186, 602, 931

(56) References Cited

U.S. PATENT DOCUMENTS

| | | |
|---|---|---|
| 3,903,592 A | 9/1975 | Hecki |
| 4,732,871 A | 3/1988 | Buchmann et al. |
| 4,737,469 A | 4/1988 | Stevens |

(Continued)

FOREIGN PATENT DOCUMENTS

| | | |
|---|---|---|
| DE | 19900169 | 7/1999 |
| EP | 0518 683 A1 | 12/1992 |
| JP | 47-5124 | 3/1972 |
| JP | 54-155482 | 10/1979 |
| JP | 59-134874 | 8/1984 |
| JP | 60-142568 | 7/1985 |
| JP | 60-154674 | 8/1985 |
| JP | 360189250 A | 9/1985 |
| JP | 63-47983 | 2/1988 |
| JP | 01059961 A | 3/1989 |
| JP | 1-106476 | 4/1989 |
| JP | 1-106477 | 4/1989 |
| JP | 1-196873 | 8/1989 |
| JP | 1-308876 | 12/1989 |
| JP | 2-10772 | 1/1990 |
| JP | 40225534 A | 8/1992 |
| JP | 9-36359 | 2/1997 |
| JP | 411150124 A | 6/1999 |
| WO | 98 19342 | 5/1998 |
| WO | WO/0167521 | 9/2001 |
| WO | 01 86727 | 11/2001 |

OTHER PUBLICATIONS

Carter et al., *Silicon Carbide and Related Materials, 1999*, Part 2, Materials Science Forum, vols. 338–342, pp. 1247–1266 (2000).

Hilton et al., *Suppression of Instabilities in 4H–SiC Microwave MESFETs*, 2000 8$^{th}$ IEEE International Symposium.

International Search Reports of PCT/US01/04957 filed Feb. 15, 2001.

Evwaraye et al., "Examination of Electrical and Optical Properties of Vanadium in Bulk n–Type Silicon Carbide," *J. Appl. Phys.* vol. 76, No. 10, 1994.

(Continued)

*Primary Examiner*—Michael S. Lebentritt
*Assistant Examiner*—Walter L. Lindsay, Jr.
(74) *Attorney, Agent, or Firm*—Myers Bigel Sibley & Sajovec

(57) ABSTRACT

The present invention provides a unit cell of a metal-semiconductor field-effect transistor (MESFET). The unit cell of the MESFET includes a delta doped silicon carbide MESFET having a source, a drain and a gate. The gate is situated between the source and the drain and extends into a doped channel layer of a first conductivity type. Regions of silicon carbide adjacent to the source and the drain extend between the source and the gate and the drain and the gate, respectively. The regions of silicon carbide have carrier concentrations that are greater than a carrier concentration of the doped channel layer and are spaced apart from the gate.

22 Claims, 5 Drawing Sheets

U.S. PATENT DOCUMENTS

| | | | |
|---|---|---|---|
| 4,757,028 A | * | 7/1988 | Kondoh et al. ............. 438/571 |
| 4,762,806 A | | 8/1988 | Suzuki et al. |
| 4,803,526 A | | 2/1989 | Terada et al. |
| 4,897,710 A | | 1/1990 | Suzuki et al. |
| 4,947,218 A | | 8/1990 | Edmond et al. |
| 5,229,625 A | | 7/1993 | Suzuki et al. |
| 5,264,713 A | | 11/1993 | Palmour |
| 5,270,554 A | | 12/1993 | Palmour |
| 5,289,015 A | | 2/1994 | Chirovsky et al. |
| 5,300,795 A | * | 4/1994 | Saunier et al. ............. 438/172 |
| 5,306,650 A | | 4/1994 | O'Mara, Jr. et al. |
| 5,396,085 A | | 3/1995 | Baliga |
| 5,399,883 A | | 3/1995 | Baliga |
| 5,510,630 A | | 4/1996 | Agarwal et al. |
| 5,686,737 A | | 11/1997 | Allen |
| 5,719,409 A | | 2/1998 | Singh et al. |
| 5,742,082 A | | 4/1998 | Tehrani et al. |
| 5,869,856 A | | 2/1999 | Kasahara |
| 5,891,769 A | | 4/1999 | Liaw et al. |
| 5,895,939 A | | 4/1999 | Ueno |
| 5,900,648 A | | 5/1999 | Harris et al. |
| 5,925,895 A | * | 7/1999 | Sriram et al. ................. 257/77 |
| 5,972,801 A | | 10/1999 | Lipkin et al. |
| 6,107,649 A | | 8/2000 | Zhao |
| 6,121,633 A | * | 9/2000 | Singh et al. .................. 257/77 |
| 6,218,680 B1 | | 4/2001 | Carter, Jr. et al. |
| 6,316,793 B1 | | 11/2001 | Sheppard et al. |
| 6,686,616 B1 | * | 2/2004 | Allen et al. ................. 257/280 |
| 2003/0017660 A1 | | 1/2003 | Weiqi |
| 2003/0075719 A1 | * | 4/2003 | Sriram ........................ 257/77 |

OTHER PUBLICATIONS

U.S. Appl. No. 09/567,717, filed May 10, 2000, Allen et al.

Konstantinov et al., *Investigation of Lo–Hi–Lo and Delta–Doped Silicon Carbide Structures*, Mat. Res. Soc. Symp. Proc., vol. 640, 2001, pp. H2.4.1–H2.4.6.

Yokogawa et al., *Electronic Properties of Nitrogen Delta–Doped Silicon Carbide Layers*, Mat. Res. Soc. Symp. Proc., vol. 640, 2001, pp. H2.5.1–H2.5.6.

Noblanc et al., *Power Density Comparison Between Microwave Power MESFETs Processed on Conductive and Semi–Insulating Wafer*, Materials Science Forum, vols. 338–342, 2000, pp. 1247–1250.

Hilton e al., *Surface Induced Instabilities in 4H–SiC Microwave MESFETs*, Materials Science Forum, vols. 338–342, 2000, pp. 1251–1254.

Nilsson et al., *Characterization of SiC MESFETs on Conducting Substrates*, Materials Science Forum, vols. 338–342, 2000, pp. 1255–1258.

Rorsman et al., *Fabrication, Characterization and Modeling of SiC MESFETs*, Materials Science Forum, vols. 338–342, 2000, pp. 12–59–1262.

Jonsson et al., *Physical Simulations on the Operations of 4H–SiC Microwave Power Transistors*, Materials Science Forum, vols. 338–342, 2000, pp. 1263–1266.

Heftman, *Wireless Semi Technology Heads Into New Territory*, Microwaves & RF, Feb. 2000, pp. 31–38.

Browne, Editorial: *The Power and the Glory*, Microwaves &RF, Dec. 1999, p. 17.

Browne, *Top Products of 1999*, Microwaves & RF, Jul. 1999, pp. 223–233.

Browne, *SiC MESFET Delivers 10–W Power at 2 GHZ*, Microwaves & RF, Oct. 1999, pp. 138–139.

*SiC MESFET Drives PCS Base Stations*, Wireless Systems Design, Oct. 1999, pp. 24.

*A 10 W 2 GHz Silicon Carbide MESFET*, Microwave Journal, Sep. 1999, pp. 232, 240, 242.

Allen, *Silicon Carbide MESFET's with 2W/mm and 50% P.A.E. at 1.8 GHz*, 1996.

Palmour et al., *Ultrafast Silicon–Carbide Rectifiers*, Powertechnics Magazine, Aug. 1989, pp. 18–21.

Palmour et al., *Characterization of Device Parameter sin High–Temperature Metal–Oxide–Semiconductor Field Effect Transistors in ∃–SiC Thin Films*, J. Appl. Phys, vol. 64, No. 4, Aug. 15, 1988, pp. 2168–2177.

Soares, ed., *GaAs MESFET Circuit Design*, Artech House, 1988, pp. 7–9, 17–18.

Palmour et al., *High–Temperature Depletion–Mode Metal–Oxide–Semiconductor Field Effect Transistors in Beta–SiC Thin Films*, Appl. Phys. Lett., vol. 51, No. 24, Dec. 14, 1987, pp. 2028–2030.

Kelner et al., *∃–SiC MESFET's and Buried–Gate JFET's*, IEEE Electron Device Letters, vol. EDL–8, No. 9, Sep. 1987, pp. 428–430.

Kong et al., *temperature Dependence of the Current–Voltage Characteristics of Metal–Semiconductor Field–Effect Transistors in n–Type ∃–SiC Grown Via Chemical Vapor Depositions*, Appl. Phys Lett., vol. 51, No. 6, Aug. 10, 1987, pp. 442–444.

*First Silicon Carbide Microwave Power Products Are Introduced*, Applied Mircowave & Wireless, pp. 104.

International Search Report of PCT/US02/32204, filed Oct. 8, 2002.

Yokogawa, et al., *Electronic Properties of Nitrogen Delta–Doped Silicon Carbide Layers*, 2001 Materials Research Society, vol. 640, H2.5.6.

Ma, et al., *High Efficiency LDMOS Power. FET for Low Voltage Wireless Communications, 1996 IEEE*.

Sze, *Physics of Semiconductor Devices, Second Edition*, John Wiley & Sons, 1981, pp. 341–347.

* cited by examiner

METHODS OF FABRICATING DELTA DOPED SILICON CARBIDE METAL-SEMICONDUCTOR FIELD EFFECT TRANSISTORS HAVING A GATE DISPOSED IN A DOUBLE RECESS STRUCTURE

RELATED APPLICATION

The present application is a divisional of and claims priority from co-pending U.S. application Ser. No. 10/136, 456, filed Oct. 24, 2001, entitled "DELTA DOPED SILICON CARBIDE METAL-SEMICONDUCTOR FIELD EFFECT TRANSISTORS HAVING A GATE DISPOSED IN A DOUBLE RECESS STRUCTURE," which is assigned to the assignee of the present application, the disclosure of which is hereby incorporated herein by reference as if set forth fully.

FIELD OF THE INVENTION

The present invention relates to microelectronic devices and more particularly to metal-semiconductor field-effect transistors (MESFETs) formed in silicon carbide.

BACKGROUND OF THE INVENTION

Electrical circuits requiring high power handling capability (>20 watts) while operating at high frequencies such as radio frequencies (500 MHz), S-band (3 GHz) and X-band (10 GHz) have in recent years become more prevalent. Because of the increase in high power, high frequency circuits there has been a corresponding increase in demand for transistors which are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs may also be limited.

Recently, metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics which affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the past, semiconductor materials which have a high electron mobility were preferred because more current could be developed with a lesser field, resulting in faster response times when a field is applied. Saturated electron drift velocity is the maximum velocity which an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

In the past, most high frequency MESFETs have been manufactured of n-type III–V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K. indicate that SiC would be suitable for high frequency, high power applications. Unfortunately, difficulty in manufacturing has limited the usefulness of SiC for high power and high frequency applications.

Recently, MESFETs having channel layers of silicon carbide have been produced on silicon substrates (see U.S. Pat. No. 4,762,806 to Suzuki et al. and U.S. Pat. No. 4,757,028 to Kondoh et al.). Because the semiconductor layers of a MESFET are epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers which result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to Palmour describes a SiC MESFET having source and drain contacts formed on $n^+$ regions of SiC and an optional lightly doped epitaxial layer between the substrate and the n-type layer in which the channel is formed. U.S. Pat. No. 5,925,895 to Sriram et al. also describes a SiC MESFET and a structure which is described as overcoming "surface effects" which may reduce the performance of the MESFET for high frequency operation. Sriram et al. also describes SiC MESFETs which use $n^+$ source and drain contact regions as well as a p-type buffer layer. However, despite the performance reported in these patents, further improvements may be made in SiC MESFETs.

For example, conventional SiC FET structures may provide the constant characteristics during the entire operating range of the FET, i.e. from fully open channel to near pinch-off voltage, by using a very thin, highly doped channel (a delta doped channel) offset from the gate by a lightly doped region of similar conductivity type. Delta doped channels are discussed in detail in an article by Yokogawa et al. entitled *Electronic Properties of Nitrogen Delta-Doped Silicon Carbide Layers*, MRS Fall Symposium, 2000 and an article by Konstantinov et al. entitled *Investigation of Lo-Hi-Lo and Delta Doped Silicon Carbide Structure*, MRS Fall Symposium, 2000. The structures discussed in these articles utilize delta doped channels and provide high breakdown voltages which is desirable for high power applications. However, these devices also have increased source and drain resistances due to the lower mobility of the delta doped channel, which is not desirable. The increased source and drain resistances cannot, typically, be overcome by simply increasing the carrier concentration of the delta doped channel because this may decrease the breakdown voltage, which may be an important device characteristic as discussed above.

SUMMARY OF THE INVENTION

Embodiments of the present invention provide a unit cell of a metal-semiconductor field-effect transistor (MESFET). The unit cell of the MESFET includes a delta doped silicon carbide MESFET having a source, a drain and a gate. The gate is situated between the source and the drain and extends into a doped channel layer of a first conductivity type. Regions of silicon carbide adjacent to the source and the drain extend between the source and the gate and the drain and the gate, respectively. The regions of silicon carbide have carrier concentrations that are greater than a carrier concentration of the doped channel layer. The regions of silicon carbide are also spaced apart from the gate.

In further embodiments of the present invention, the delta doped silicon carbide MESFET and the regions of silicon carbide include a silicon carbide substrate and a delta doped layer of a first conductivity type silicon carbide on the substrate. The doped channel layer of the first conductivity type silicon carbide on the delta doped layer has a carrier concentration that is less than at least one carrier concentration of the delta doped layer. Ohmic contacts on the doped channel layer may respectively define the source and the drain. A cap layer of the first conductivity type silicon carbide on the doped channel layer has a carrier concentration that is greater than the carrier concentration of the doped channel layer. A first recess is positioned between the source and the drain. The first recess has a first floor that extends through the cap layer into the doped channel layer a first distance. The gate is in the first recess and extends into the doped channel layer. A second recess is positioned between the source and the drain and has a second floor that extends a second distance, less than the first distance, through the cap layer to the doped channel layer. The second recess has respective sidewalls which are between respective ones of the source and the gate and the drain and the gate and are spaced apart from the gate, the source and the drain so as to define regions of the cap layer extending between respective ones of the source and the gate and the drain and the gate to provide the regions of silicon carbide.

In further embodiments of the present invention, the second floor of the second recess extends into the doped channel layer a third distance. The silicon carbide substrate may be a semi-insulating silicon carbide substrate. The first conductivity type silicon may be n-type conductivity silicon carbide or p-type conductivity silicon carbide.

In still further embodiments of the present invention the regions of silicon carbide may be implanted regions. In other embodiments of the present invention, the regions of silicon carbide are grown in a single growth step with the delta doped layer and the doped channel layer. In further embodiments of the present invention, the delta doped layer, the doped channel layer and the cap layer are grown on the substrate.

In additional embodiments of the present invention, the cap layer may have a carrier concentration of from about $3\times10^{17}$ cm$^{-3}$ to about $6\times10^{17}$ cm$^{-3}$ and a thickness of from about 500 Å to about 1000 Å. The delta doped layer may have a carrier concentration from about $2\times10^{18}$ cm$^{-3}$ to about $3\times10^{18}$ cm$^{-3}$ and a thickness from about 200 Å to about 300 Å. The doped channel layer may have a carrier concentration of from about $1\times10^{16}$ cm$^{-3}$ to about $5\times10^{16}$ cm$^{-3}$ and a thickness of from about 1800 Å to about 3500 Å.

In further embodiments of the present invention, the MESFET further includes a buffer layer of a second conductivity type silicon carbide between the substrate and the delta doped layer. For a p-type buffer layer, the buffer layer may have a carrier concentration of about $1.0\times10^{16}$ cm$^{-3}$ to about $6\times10^{16}$ cm$^{-3}$, but typically about $1.5\times10^{16}$ cm$^{-3}$. The buffer layer may have a thickness of from about 0.2 μm to about 0.5 μm. For an n-type buffer layer, the buffer layer may have a carrier concentration of about $1\times10^{15}$ cm$^{-3}$ or less and a thickness of about 0.25 μm. The second conductivity type silicon carbide may be p-type conductivity silicon carbide, n-type conductivity silicon carbide or undoped silicon carbide.

In still further embodiments of the present invention, the MESFET may further include regions of first conductivity type silicon carbide under the source and the drain which has a carrier concentration that is greater than the carrier concentration of the doped channel layer. The region of first conductivity type silicon carbide may have a carrier concentration of at least about $1\times10^{19}$ cm$^{-3}$. In other embodiments of the present invention, the MESFET may further include an oxide layer on the cap layer and the doped channel layer.

In further embodiments of the present invention the ohmic contacts comprise nickel contacts. The MESFET may further comprise an overlayer on the ohmic contacts. In still further embodiments of the present invention, the delta doped layer and the doped channel layer form a mesa having sidewalls which define the periphery of the transistor and which extend through the delta doped layer and the doped channel layer. The sidewalls of the mesa may or may not extend into the substrate.

In additional embodiments of the present invention, the first distance may be from about 0.07 μm to about 0.25 μm and the second distance may be from about 500 Å to about 1000 Å. The gate may include a first gate layer of chromium on the doped channel layer and an overlayer on the first gate layer that comprises platinum and gold. Alternatively, the gate may include a first gate layer of nickel on the doped channel layer and an overlayer on the first gate layer, wherein the overlayer comprises gold. The gate may have a length from about 0.4 μm to about 0.7 μm. The distance from the source to the gate may be from about 0.5 μm to about 0.7 μm. The distance from the drain to the gate may be from about 1.5 μm to about 2 μm. The distance between the source and a first one of the sidewalls of the second recess may be from about 0.1 μm to about 0.4 μm and the distance between the drain and a second one of the sidewalls of the second recess may be from about 0.9 μm to about 1.7 μm. The distance between a first one of the sidewalls of the second recess and the gate may be from about 0.3 μm to about 0.6 μm and the distance between a second one of the sidewalls of the second recess and the gate may be from about 0.3 μm to about 0.6 μm. The distance from a first gate in a transistor comprising a plurality of unit cells to a second gate may be from about 20 μm to about 50 μm.

While the present invention is described above primarily with reference to SiC MESFETs, methods of fabricating SiC MESFETs are also provided.

DETAILED DESCRIPTION OF THE INVENTION

The present invention will now be described with reference to the FIGS. 1 and 2A–2H which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being formed "directly" on the layer or substrate. Like numbers refer to like elements throughout.

Embodiments of the present invention will now be described in detail below with reference to FIGS. 1 and 2A–2H which illustrate various embodiments of the present invention and various processes of fabricating embodiments of the present invention. A metal-semiconductor field effect transistor (MESFET) is provided having a delta doped layer, i.e. very thin, highly doped layer, offset from the gate by a doped channel layer that is lightly doped relative to the delta doped layer. As described in detail below, a double recessed gate structure is provided which may increase breakdown voltage and lower source and drain resistances relative to conventional MESFETs. MESFETs according to embodiments of the present invention may be fabricated using existing fabrication techniques as discussed below. MESFETs according to embodiments of the present invention may be useful in, for example, high efficiency linear power amplifiers, such as power amplifiers for base stations using complex modulation schemes such as code division multiple access (CDMA) and/or Wideband CDMA (WCDMA).

Figure 1:
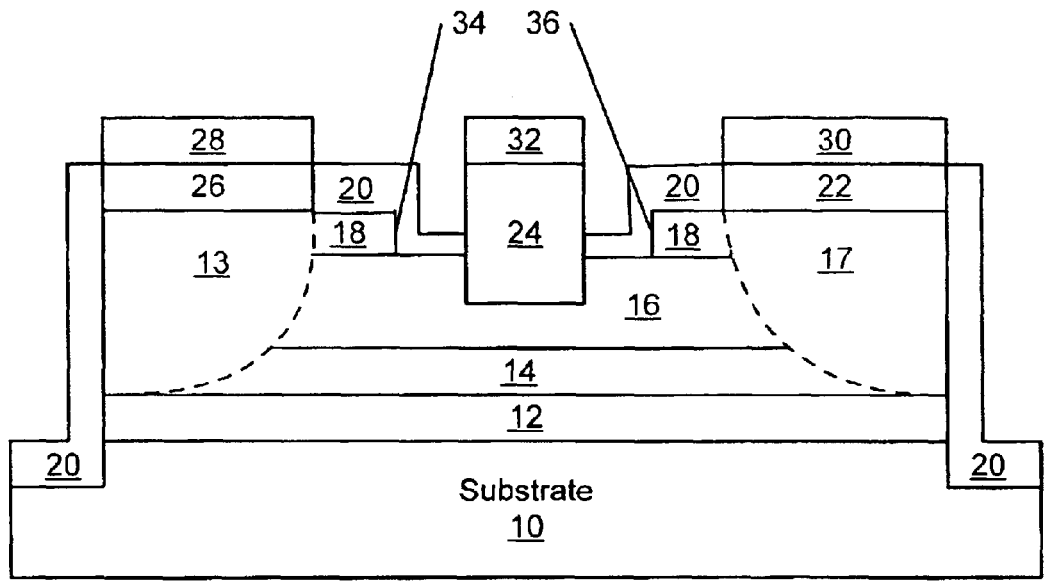
FIG. 1 is a cross-sectional view of a metal-semiconductor field effect transistor (MESFET) according to embodiments of the present invention.

Referring to FIG. 1, metal-semiconductor field effect transistors (MESFETs) according to embodiments of the present invention will now be described in detail. As seen in FIG. 1, a single crystal bulk silicon carbide (SiC) substrate 10 of either p-type or n-type conductivity or semi-insulating is provided. The substrate may be formed of silicon carbide selected from the group of 6H, 4H, 15R or 3C silicon carbide.

An optional buffer layer 12 of p-type silicon carbide may be provided on the substrate 10. The optional buffer layer 12 is preferably formed of p-type conductivity silicon carbide of 6H, 4H, 15R or 3C polytype. The buffer layer may have a carrier concentration of about $1.0 \times 10^{16}$ cm$^{-3}$ to about $6 \times 10^{16}$ cm$^{-3}$, but typically about $1.5 \times 10^{16}$ cm$^{-3}$. Suitable dopants include aluminum, boron and gallium. The buffer layer 12 may have a thickness of from about 0.2 μm to about 0.5 μm. Although the buffer layer 12 is described above as p-type silicon carbide, the invention should not be limited to this configuration. Alternatively, the buffer layer may be undoped silicon carbide or a very low doped n-type conductivity silicon carbide. If a low doped silicon carbide is utilized for the buffer layer 12, it is preferred that the carrier concentration of the buffer layer 12 be less than about $5 \times 10^{15}$ cm$^{-3}$. If an undoped or n-type buffer layer 12 is utilized, the substrate 10 is preferably a semi-insulating silicon carbide substrate.

The buffer layer 12 may be disposed between the substrate 10 and a delta doped layer 14 which may be either n-type or p-type silicon carbide. The delta doped layer 14 typically has doping impurities that are uniformly distributed within a very thin, two-dimensional layer and typically has a high carrier concentration. However, the delta doped layer 14 may also have a doping profile, i.e. a representation of the carrier concentrations of different portions of the delta doped layer 14 typically having varying depths, with one or more spikes having a higher carrier concentration in the profile.

The delta doped layer 14, a doped channel layer 16 and a cap layer 18, all of n-type silicon carbide, may be provided on the substrate 10, as shown in FIG. 1. Thus, the doped channel layer 16 is on the delta doped layer 14 and the cap layer 18 is on the doped channel layer 16. If the optional buffer layer 12 is provided on the substrate 10, the delta doped layer 14, the doped channel layer 16 and the cap layer 18 may be provided on the optional buffer layer 12. Because the delta doped layer may contain a single spike or multiple spikes in its doping profile as discussed above, the doped channel layer 16 has a carrier concentration that is less than the carrier concentration of at least one of the spikes in the doping profile of the delta doped layer 14. The carrier concentration of the doped channel layer 16 is also less than the carrier concentration of the cap layer 18. Thus, the doped channel layer 16 is lightly doped, i.e. has a smaller carrier concentration, relative to both the delta doped layer 14 and the cap layer 18.

The delta doped layer 14 may be formed of n-type conductivity silicon carbide of 6H, 4H, 15R or 3C polytype.

N-type carrier concentrations of the delta doped n-type layer from about $2\times10^{18}$ cm$^{-3}$ to about $3\times10^{18}$ cm$^{-3}$ are suitable. Suitable dopants include nitrogen and phosphorous. The delta doped layer 14 may have a thickness from about 200 Å to about 300 Å. The doped channel layer 16 may have a carrier concentration of from about $1\times10^{16}$ cm$^{-3}$ to about $5\times10^{16}$ cm$^{-3}$ and may be formed of n-type conductivity silicon carbide of 6H, 4H, 15R or 3C polytype. The doped channel layer 16 may further have a thickness of from about 1800 Å to about 3500 Å. Finally, the cap layer 18 may have a carrier concentration of from about $3\times10^{17}$ cm$^{-3}$ to about $6\times10^{17}$ cm$^{-3}$ and a thickness of from about 500 Å to about 1000 Å.

Although the delta doped layer 14, the doped channel layer 16 and the cap layer 18 are described above as being of n-type conductivity silicon carbide, it will be understood that the present invention is not limited to this configuration. Alternatively, for example, in a complementary device, the delta doped layer 14, the doped channel layer 16 and the cap layer 18 may be of p-type conductivity silicon carbide.

As further illustrated in FIG. 1, n$^+$ regions 13 and 17 are provided in the source and drain regions of the device, respectively. As used herein, "n$^+$" or "p$^+$" refer to regions that are defined by higher carrier concentrations than are present in adjacent or other regions of the same or another layer or substrate. Regions 13 and 17 are typically of n-type conductivity silicon carbide and have carrier concentrations that are greater than the carrier concentration of the doped channel layer 16. For the n$^+$ regions 13 and 17, carrier concentrations of about $1\times10^{19}$ cm$^{-3}$ are suitable, but carrier concentrations as high as possible are preferred.

Ohmic contacts 26 and 22, may be provided on the implanted regions 13 and 17, and are spaced apart so as to provide a source contact 26 and a drain contact 22. The ohmic contacts 26 and 22 are preferably formed of nickel or other suitable metals. An oxide layer 20 may be further provided on the exposed surface of the device.

MESFETs according to embodiments of the present invention include a first recessed section and a second recessed section. The first recessed section has a floor that extends through the cap layer 18 a distance of from about 500 Å to about 1000 Å to the doped channel layer 16. The second recessed section is provided between the sidewalls 34, 36 of the first recessed section. A first sidewall 34 of the first recessed section is between the source 26 and the gate 24 and a second sidewall 36 of the first recessed section is between the drain 22 and the gate 24. The floor of the second recessed section extends into the doped channel layer 16 a distance of from about 0.07 μm to about 0.25 μm. The floor of the first recessed section may also extend further into the doped channel layer 16, for example, about 100 Å further, but does not extend as far into the doped channel layer 16 as the floor of the second recessed section. Furthermore, the distance between the source 26 and the first sidewall 34 of the first recessed structure may be from about 0.1 μm to about 0.4 μm. The distance between the drain 22 and the second sidewall 36 of the first recessed structure may be from about 0.9 μm to about 1.7 μm. The distance between the first sidewall 34 of the first recessed section and the gate 24 may be from about 0.3 μm to about 0.6 μm. The distance between the second sidewall 36 of the first recessed section and the gate 24 is from about 0.3 μm to about 0.6 μm.

It will be understood that although the recessed sections described above are termed first and second recessed sections, these recessed sections should not be limited by these terms. These terms are only used to distinguish one recessed section from another recessed section. Thus, the first recessed section discussed above could be termed the second recessed section, and similarly, the second recessed section above could be termed the first recessed section.

A gate contact 24 is provided in the second recessed section between the sidewalls 34, 36 of the first recessed section. The gate contact 24 may be formed of chromium, platinum, or platinum silicide, nickel, or TiWN, however, other metals such as gold, known to one skilled in the art to achieve the Schottky effect, may be used. However, the Schottky gate contact 24 typically has a three layer structure. Such a structure may have advantages because of the high adhesion of chromium (Cr). For example, the gate contact 24 can optionally include a first gate layer of chromium (Cr) contacting the doped channel layer 16. The gate contact 24 may further include an overlayer of platinum (Pt) and gold 46 or other highly conductive metal. Alternatively, the gate contact 24 may include a first layer of nickel on the floor of the second recessed section on the doped channel layer 16. The gate contact 24 may further include an overlayer on the first layer of nickel which includes a layer of gold. As illustrated, optional metal overlayers 28, 30 and 32 may be provided on the source and drain contacts 26 and 22 and the gate contact 24. The overlayers 28, 30 and 32 may be gold, silver, aluminum, platinum and copper. Other suitable highly conductive metals may also be used for the overlayer.

The thickness of the n-type conductivity regions beneath the gate contact defines the cross-sectional height of the channel region of the device and is selected based on the desired pinch-off voltage of the device and the carrier concentration. Given the carrier concentrations of the doped channel layer and the delta doped layer, the depths of these layers for a given pinch-off voltage may be readily calculated using methods known to one skilled in the art. Accordingly, it is desirable for the thickness and carrier concentrations of the doped channel layer to be selected to provide a pinch-off voltage of greater than −3 volts and preferably greater than −5 volts. The pinch off voltage may also be from between about −3 volts and −20 volts, but typically between about −5 volts and −15 volts.

In selecting the dimensions of the MESFET, the width of the gate is defined as the dimension of the gate perpendicular to the flow of current. As shown in the cross-section of FIG. 1, the gate width runs into and out of the page. The length of the gate is the dimension of the gate parallel to the flow of current. As seen in the cross-sectional views of FIG. 1, the gate length is the dimension of the gate 24 which is in contact with the doped channel layer 16. For example, the gate length of the MESFET according to embodiments of the present invention may be from about 0.4 μm to about 0.7 μm. Another important dimension is the source to gate distance which is shown in the cross-section of FIG. 1, as the distance from the source contact 26 or n$^+$ region 13, to the gate contact 24. The source to gate distance according to embodiments of the present invention may be from about 0.5 μm to about 0.7 μm. Furthermore, the distance from the drain 22 to the gate 24 may be from about 1.5 μm to about 2 μm. Embodiments of the present invention may further include a plurality of unit cells of MESFETS, and the distance from a first gate of the unit cells to a second gate may be from about 20 μm to about 50 μm.

Figure 2A:
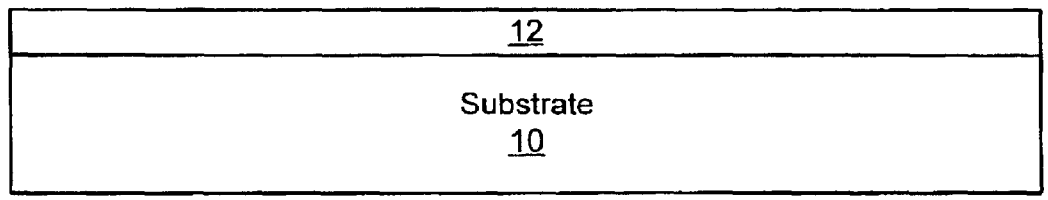
FIGS. 2A through 2H illustrate processing steps in the fabrication of MESFETS according to embodiments of the present invention.

FIGS. 2A through 2H illustrate the fabrication of FETs according to embodiments of the present invention. As seen in FIG. 2A, an optional buffer layer 12 may be grown or deposited on a SiC substrate 10. The substrate 10 may be a semi-insulating SiC substrate, a p-type substrate or an n-type substrate. The optional buffer layer 12 may be of p-type conductivity silicon carbide having carrier concentration of about 1.5×10$^{16}$ cm$^{-3}$ or less. Alternatively, the buffer layer may be n-type silicon carbide or undoped silicon carbide.

If the substrate 10 is semi-insulating it may be fabricated as described in commonly assigned and co-pending U.S. patent application Ser. No. 09/313,802 entitled "Semi-insulating Silicon Carbide Without Vanadium Domination", the disclosure of which is hereby incorporated by reference herein as if set forth in its entirety. Such a semi-insulating substrate may be produced by providing silicon carbide substrates with sufficiently high levels of point defects and sufficiently matched levels of p-type and n-type dopants such that the resistivity of the silicon carbide substrate is dominated by the point defects. Such a domination may be accomplished by fabricating the silicon carbide substrate at elevated temperatures with source powders which have concentrations of heavy metals, transition elements or other deep level trapping elements of less than about 1×10$^{16}$ cm$^{-3}$ and preferably less than about 1×10$^{14}$ cm$^{-3}$. For example, temperatures between about 2360° C. and 2380° C. with the seed being about 300° C. to about 500° C. lower may be utilized. Thus, it is preferred that the semi-insulating substrate be substantially free of heavy metal, transition element dopants or other deep level trapping elements, such as vanadium, such that the resistivity of the substrate is not dominated by such heavy metals or transition elements. While it is preferred that the semi-insulating substrate be free of such heavy metal, transition element dopants or deep level trapping elements, such elements may be present in measurable amounts while still benefiting from the teachings of the present invention if the presence of such materials does not substantially affect the electrical properties of the MESFETs described herein.

Figure 2B:
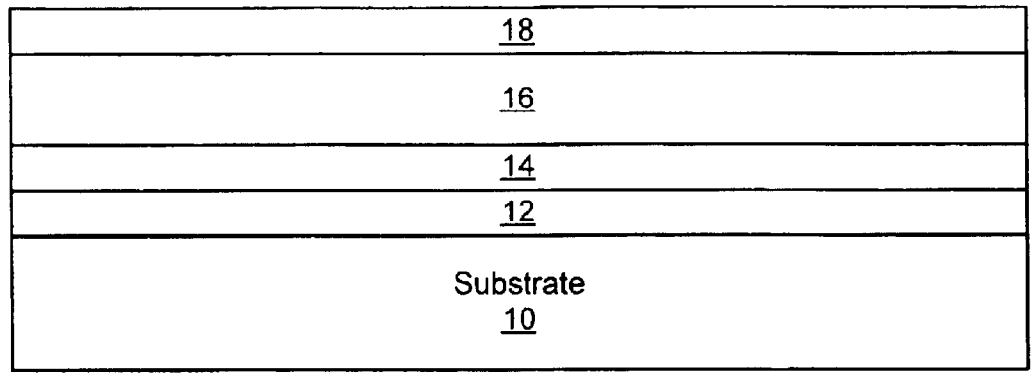

As seen in FIG. 2B, a delta doped layer 14, a doped channel layer 16 and a cap layer 18 are grown or deposited on the optional buffer layer 12. It will be understood that if the buffer layer 12 is not included, the delta doped layer, doped channel layer 16 and cap layer 18 may be grown or deposited on the substrate 10. The delta doped layer 14 is formed on the buffer layer 12, the doped channel layer 16 is formed on the delta doped layer 14 and the cap layer 18 is formed on the doped channel layer 16 as illustrated in FIG. 2B. It will be understood that the delta doped layer 14, the doped channel layer 16 and the cap layer 18 may be grown in a single growth step by changing the source material concentration a first time to grow the doped channel layer 16 and a second time to grow the cap layer 18. The delta doped layer 14, the doped channel layer 16 and the cap layer 18 may also be grown in multiple growth steps. Alternatively, the cap layer 18 may be formed by ion implantation.

Figure 2C:
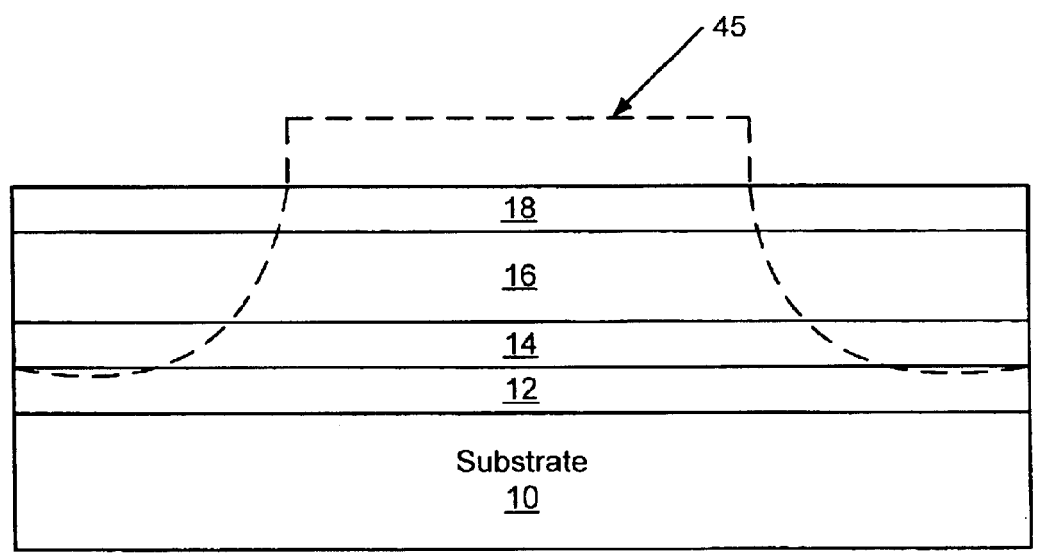
Figure 2D:
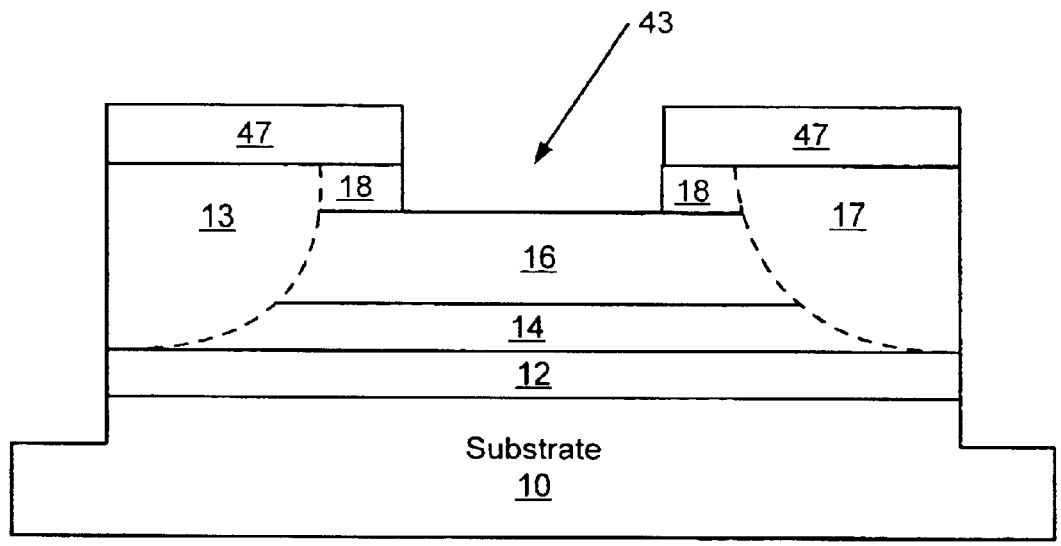

As illustrated in FIG. 2C, a mask 45 may be formed for implanting n+ regions 13 and 17. Regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 45 to form n$^+$ regions 13 and 17 as illustrated in FIG. 2D. Thus, the ions are implanted in portions of the delta doped layer 14, the doped channel layer 16 and the cap layer 16 to provide highly doped regions of n-type conductivity silicon carbide having higher carrier concentrations than the doped channel layer 16. Once implanted, the dopants are annealed to activate the implant.

As seen in FIG. 2D, the substrate 10, buffer layer 12, delta doped layer 14, doped channel layer 16, cap layer 18 and n+ regions 13 and 17 may be etched to form an isolation mesa which defines the periphery of the device. The substrate 10, the delta doped layer 14, the doped channel layer 16, the cap layer 18 and n$^+$ regions 13 and 17 form a mesa having sidewalls which define the periphery of the transistor. The sidewalls of the mesa extend downward past the delta doped layer 14 of the device. Typically, the mesa is formed to extend into the substrate 10 of the device as shown in FIG. 2C. The mesa may extend past the depletion region of the device to confine current flow in the device to the mesa and reduce the capacitance of the device. If the depletion region of the device extends below the level of the mesa then it may spread to areas outside the mesa, resulting in larger capacitance. The mesa is preferably formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

FIG. 2D further illustrates the formation of a first recess 43 of the MESFET. The first recess 43 may be formed by forming a mask 47 for the first recess 43 and then etching through the cap layer 18 a distance of from about 500 Å to about 1000 Å to form the recess according to the mask 47. The cap layer 18 is etched through at least to the doped channel layer 16 to form the first recess 43. The first recess 43 may be formed by an etching process, such as a dry or wet etch process. Alternatively, the etch may continue into the doped channel layer 16, for example, about 100 Å further. Etching the first recess so that the recess extends into the doped channel layer 16 is preferred to not reaching the doped channel layer 16.

Figure 2E:
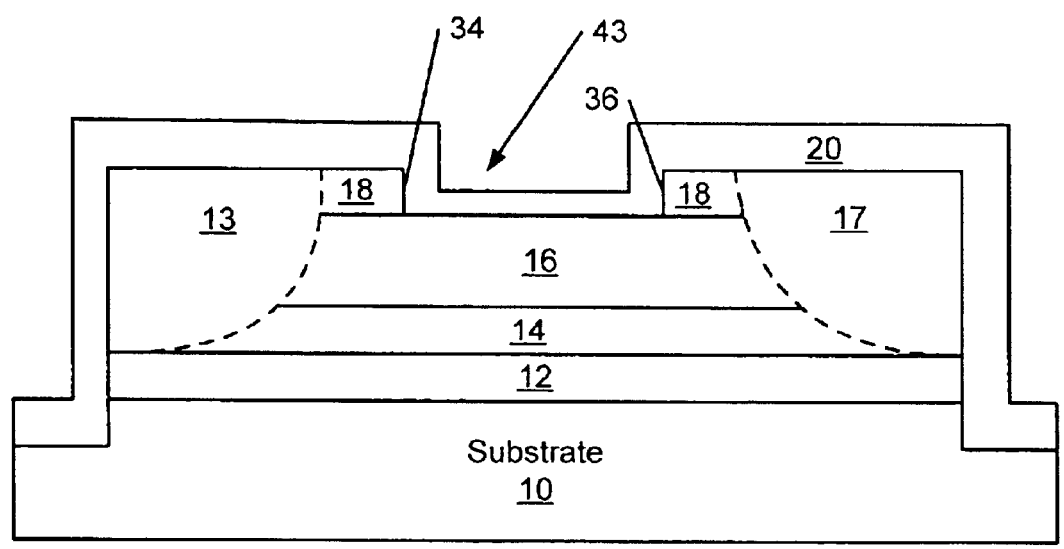

FIG. 2E illustrates the formation of an oxide layer 20 after the first recess 43 has been formed as discussed above. The oxide layer may be grown or deposited over the exposed surface of the existing structure, i.e. on the isolation mesa, n$^+$ regions 13 and 17, the cap layer 18 and the doped channel layer 16 in the first recess 43. The oxidation process removes SiC that may have been damaged by the etch process and also smoothes out roughness that may have been created on the surface by the etch. This may enable the etch of the second recess discussed below, performed prior to formation of the gate metalization, to be much shallower, minimizing the sub-surface damage and surface roughness that, typically, cannot be removed.

Figure 2F:
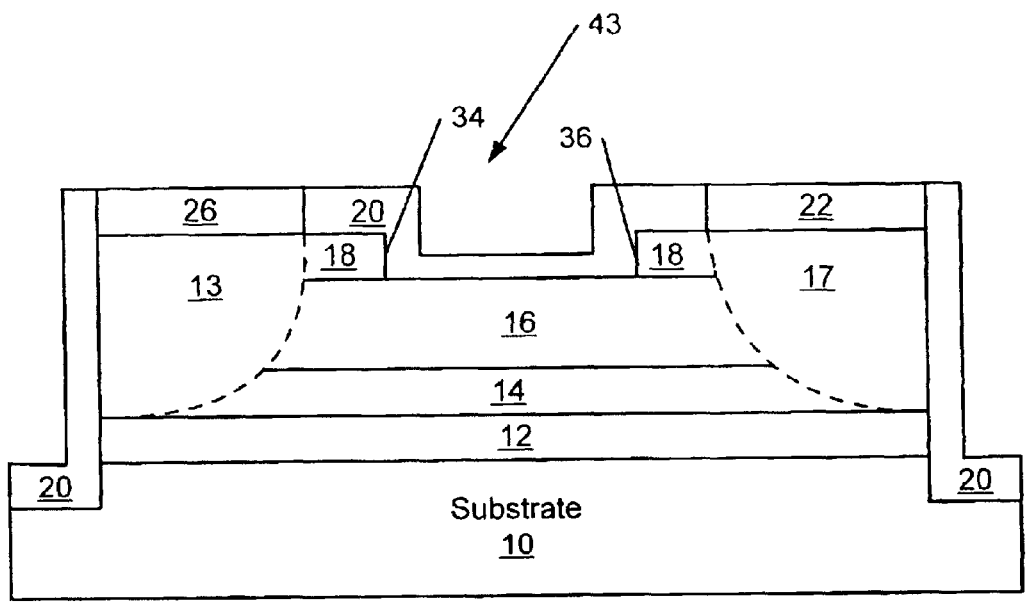

Contact windows may be etched through the oxide layer 20 to the n+ regions 13 and 17. Nickel may then be evaporated to deposit the source and drain contacts 26 and 22 and annealed to form the ohmic contacts as illustrated in FIG. 2F. Such a deposition and annealing process may be carried out utilizing conventional techniques known to those of skill in the art. For example, the ohmic contacts may be annealed at a temperature of about 1050° C. for about 2 minutes. However, other times and temperatures, such as temperatures of from about 800 to about 1150° C. and times from about 30 seconds to about 10 minutes may also be utilized.

Figure 2G:
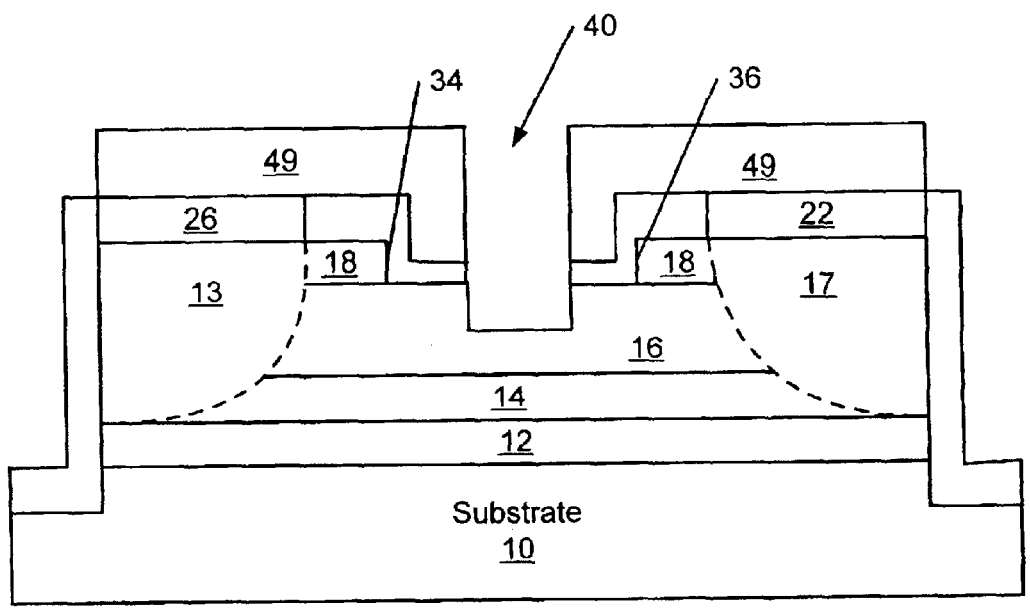

FIG. 2G illustrates the formation of a second recess for the gate structure of the MESFET. The second recess 40 may be formed by forming a mask 49 for the second recess and then etching the recess according to the mask 49. The doped channel layer 16 may be etched into a distance of from about 0.07 $\mu$m to about 0.25 $\mu$m to form the recess 40. It will be understood that these distances of the etch into the doped channel layer 16 do not include the etch through the oxide layer 20.

The first and second recesses 43 and 40 discussed above may be formed by dry etching, for example, Electron Cyclotron Resonance (ECR) or Inductively Coupled Plasma (ICP) etching. Alternatively, the recesses discussed above may be formed in two steps with a double recess process. For example, the Schottky gate contact 24 may be formed in the second recessed section through an oxide layer 20 and into the doped channel layer 16. The oxide layer 20 may be first etched through and then a second etch performed to etch into the doped channel layer 16. The depth of the first etch can be all the way through the oxide layer 20, or it may be only partially through the oxide layer 20. The preferred depth into the doped channel layer 16 for the second etch is from about 0.07 µm to about 0.25 µm. Similarly, the first recessed section may be etched in a two step etch, first etching through the cap layer 18 extending to or into the doped channel layer 16 as discussed above.

The two etch approach may have a number of advantages over a single etch process. One advantage may be that the first etch can be performed prior to any metalization on the wafer, allowing a thermal oxide to be grown subsequent to etching with respect to the first recessed section. The thermal oxidation process removes SiC that may have been damaged by the etch process and also smoothes out roughness that may have been created on the surface by the etch. This may enable the second etch of the second recessed section, performed prior to formation of the gate metalization, to be much shallower, minimizing the sub-surface damage and surface roughness that, typically, cannot be removed. Another advantage of the two etch approach may be that the shallower second etch may reduce the amount of gate contact to the etched sidewall. This minimizes the contact area with potentially damaged material and the reduced contact area may also reduce the gate capacitance and, therefore, improve the frequency response of the transistor.

Figure 2H:
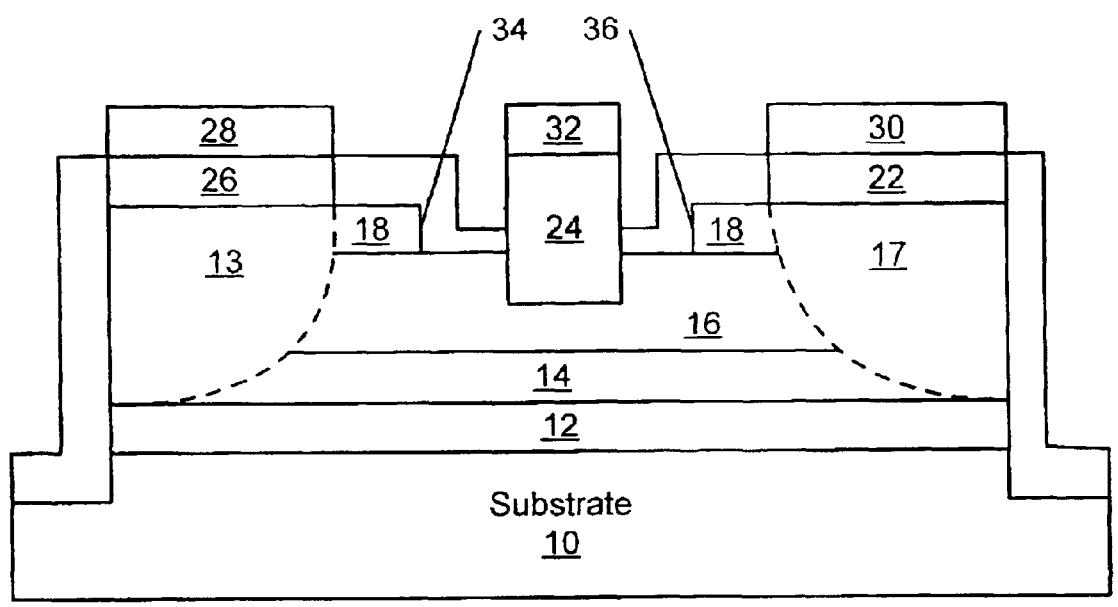

FIG. 2H illustrates the formation of the gate contact 24 and the optional overlayers 28, 30 and 32 as discussed above. For example, a layer of chromium may be deposited in the second recess 40. Typically, the chromium layer is formed by evaporative deposition. The gate structure may then be completed by deposition of platinum and gold. As will also be appreciated by those of skill in the art, the overlayers 28 and 30 may be formed either before or after formation of the gate structure. In fact, if the titanium/platinum/gold structure is utilized, the platinum and gold portions of the overlayer may be formed in the same processing steps as the platinum and gold portions 32 of the gate structure. Accordingly, the overlayers 28 and 30 may be formed prior to the formation of a gate contact or after the formation of a gate contact.

As is briefly described above, MESFETs according to embodiments of the present invention provide a double recessed gate structure which may simultaneously increase breakdown voltage and reduce source and drain resistances relative to conventional MESFETs. This may provide an advantage over conventional field effect transistors utilizing delta doped layers that sacrifice source and drain resistance to obtain a high breakdown voltage.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a metal-semiconductor field-effect transistor (MESFET), comprising:
    forming a delta doped silicon carbide MESFET having a source, a drain and a gate, the gate being between the source and the drain and extending into a doped channel layer of a first conductivity type; and
    forming regions of silicon carbide adjacent to the source and the drain and extending between respective ones of the source and the gate and the drain and the gate, having a carrier concentration that is greater than a carrier concentration of the doped channel layer and being spaced apart from the gate.

2. A method according to claim 1, wherein forming a delta doped silicon carbide MESFET and forming regions of silicon carbide comprise:
    forming a delta doped layer of a first conductivity type silicon carbide on a silicon carbide substrate;
    forming the doped channel layer of the first conductivity type silicon carbide on the delta doped layer having a carrier concentration that is less than at least one carrier concentration of the delta doped layer;
    forming ohmic contacts on the doped channel layer that respectively define the source and the drain;
    forming a cap layer of the first conductivity type silicon carbide on the doped channel layer and having a carrier concentration that is greater than the carrier concentration of the doped channel layer;
    forming a first recess between the source and the drain having a first floor that extends through the cap layer into the doped channel layer a first distance;
    forming the gate in the first recess and extending into the doped channel layer; and
    forming a second recess between the source and the drain having a second floor that extends a second distance, less than the first distance, through the cap layer to the doped channel layer and having respective sidewalls which are between respective ones of the source and the gate and the drain and the gate and spaced apart from the gate, the source and the drain so as to define regions of the cap layer extending between respective ones of the source and the gate and the drain and the gate to provide the regions of silicon carbide.

3. A method according to claim 2, wherein the steps of forming a delta doped layer, a doped channel layer and a cap layer comprises the step of epitaxially growing the delta doped layer, the doped channel layer and the cap layer in a single growth step.

4. A method according to claim 3, wherein a source material concentration in the single growth step is changed a first time to grow the doped channel layer and changed a second time to grow the cap layer.

5. A method according to claim 3 wherein the step of forming a cap layer comprises implanting dopants of the first conductivity type in the doped channel layer.

6. A method according to claim 2, wherein the steps of forming a delta doped layer, a doped channel layer and a cap layer comprise the steps of depositing the delta doped layer, depositing the doped channel layer and depositing the cap layer.

7. A method according to claim 2, wherein the first conductivity type silicon carbide comprises n-type conductivity silicon carbide.

8. A method according to claim 2, wherein the first conductivity type silicon carbide comprises p-type conductivity silicon carbide.

9. A method according to claim 2, further comprising the step of forming a buffer layer between the substrate and the delta doped layer.

10. A method according to claim 9, wherein forming a buffer layer comprises the step of forming a p-type conductivity silicon carbide layer.

11. A method according to claim 9, wherein forming a buffer layer comprises the step of forming an n-type conductivity silicon carbide layer.

12. A method according to claim 9, wherein forming a buffer layer comprises the step of forming an undoped silicon carbide layer.

13. A method according to claim 2, wherein the step of forming ohmic contacts comprises:

etching a contact window through the cap layer in a region adjacent a source region of the MESFET; and forming the ohmic contact in the contact window.

14. A method according to claim 2, further comprising:

implanting n-type dopants in regions under the source and drains so as to provide a highly doped region of n-type conductivity silicon carbide having a higher carrier concentration than the doped channel layer;

wherein the step of forming ohmic contacts comprises forming ohmic contacts on the highly doped regions.

15. A method according to claim 14, further comprising the step of etching the delta doped layer, the doped channel layer, the cap layer and the highly doped regions to form a mesa.

16. A method according to claim 14, wherein the step of implanting n-type dopants further comprises annealing the n-type dopants to activate the n-type dopants.

17. A method according to claim 2, further comprising the step of growing an oxide layer on the MESFET.

18. A method according to claim 2, further comprising the step of depositing an oxide layer on the MESFET.

19. A method according to claim 2, wherein forming the second recess comprises:

forming a mask on the cap layer for the second recess;

etching through the cap layer the second distance extending to the doped channel layer according to the mask.

20. A method according to claim 2, wherein forming the second recess comprises:

forming a mask on the cap layer for the second recess;

etching through the cap layer extending into the doped channel layer the second distance according to the mask.

21. A method according to claim 2, wherein forming the first recess comprises:

forming a mask for the first recess;

etching into the second floor the first distance according to the mask.

22. A method of forming a MESFET, comprising:

forming buffer layer of a second conductivity type on a silicon carbide substrate;

epitaxially growing a delta doped layer, a doped channel layer, and a cap layer all of a first conductivity type, in a single growth step changing a source material carrier concentration a first time to grow the doped channel layer and a second time to grow the cap layer;

forming a mask for a first conductivity type implant;

implanting first conductivity type implant and activating the first conductivity type implant with an anneal;

etching the delta doped layer, the doped channel layer, the cap layer and the first conductivity type implant to form a mesa;

forming a mask for a first recess and etching the first recess between a source and a drain having a first floor that extends through the oxide layer and the cap layer and into the doped channel layer a first distance and having respective sidewalls which are between respective ones of the source and a gate and the drain and the gate;

growing an oxide layer on the cap layer and in the first recess;

opening windows for the source and the drain;

forming ohmic contacts on the windows;

forming a mask for a second recess;

etching a second recess that extends into the doped channel layer a second distance greater than the first distance; and forming a gate in the second recess that extends into the doped channel layer.

* * * * *